United States Patent
Yan (10) Patent No.: US 11,868,053 B2
(45) Date of Patent: Jan. 9, 2024

(54) METHOD FOR ACCURATELY OBTAINING PHOTOLITHOGRAPHY PARAMETER

(71) Applicant: CHANGXIN MEMORY TECHNOLOGIES, INC., Hefei (CN)

(72) Inventor: Xun Yan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 340 days.

(21) Appl. No.: 17/391,215

(22) Filed: Aug. 2, 2021

(65) Prior Publication Data

US 2022/0043360 A1 Feb. 10, 2022

Related U.S. Application Data

(63) Continuation of application No. PCT/CN2021/097740, filed on Jun. 1, 2021.

(30) Foreign Application Priority Data

Aug. 5, 2020 (CN) .......................... 202010777000.8

(51) Int. Cl.
G03F 7/00 (2006.01)

(52) U.S. Cl.
CPC ...... G03F 7/70625 (2013.01); G03F 7/70641 (2013.01)

(58) Field of Classification Search
CPC .... G03F 7/70625; G03F 7/70641; G03F 7/20; G03F 7/705; G03F 7/70558

See application file for complete search history.

(56) References Cited

U.S. PATENT DOCUMENTS

| 6,501,534 B1 | 12/2002 | Singh |
| 6,546,125 B1 | 4/2003 | Su |
| 7,960,078 B2 | 6/2011 | Sawai |

(Continued)

FOREIGN PATENT DOCUMENTS

| CN | 101061568 A | 10/2007 |
| CN | 103995439 A | 8/2014 |

(Continued)

OTHER PUBLICATIONS

Supplementary European Search Report in European application No. 21772657.9, dated Jun. 7, 2022, 5 pgs.

(Continued)

*Primary Examiner* — Stacy Whitmore
(74) *Attorney, Agent, or Firm* — Cooper Legal Group, LLC (57) ABSTRACT

A method for accurately obtaining a photolithography parameter. In the method, photolithography is performed on a target carrier with different preset photolithography parameters by using a same mask pattern as a mask, to obtain a plurality of target patterns. Each of the target pattern is compared with a standard pattern to obtain an evaluation value, and the target pattern is set as a valid pattern, when the evaluation value corresponding to the target pattern is greater than or equal to a preset value. A Bosung curve is drawn by taking a line width of the valid pattern and a preset photolithography parameter corresponding to the line width as data. The photolithography parameter corresponding to a preset line width is obtained according to the Bosung curve.

11 Claims, 5 Drawing Sheets

(56) References Cited

U.S. PATENT DOCUMENTS

| | | |
|---|---|---|
| 8,500,950 B2 | 8/2013 | Sawai |
| 10,133,191 B2 | 11/2018 | Tel et al. |
| 10,401,737 B2 | 9/2019 | Hofmann et al. |
| 2004/0223137 A1 | 11/2004 | Littau |
| 2007/0298335 A1 | 12/2007 | Sawai |
| 2011/0220287 A1* | 9/2011 | Sawai ................ H01L 22/12 156/345.24 |
| 2017/0160648 A1 | 6/2017 | Tel et al. |
| 2018/0173108 A1 | 6/2018 | Hofmann et al. |
| 2020/0089131 A1 | 3/2020 | Kameishi |

FOREIGN PATENT DOCUMENTS

| | | |
|---|---|---|
| CN | 110544640 A | 12/2019 |
| CN | 110632827 A | 12/2019 |
| CN | 111289261 A | 6/2020 |
| CN | 111311582 A | 6/2020 |
| EP | 3339957 A1 | 6/2018 |

OTHER PUBLICATIONS

International Search Report in the international application No. PCT/CN2021/097740, dated Aug. 27, 2021, 3 pgs.

\* cited by examiner

FIG. 1

| D/F | -0.33 | -0.3 | -0.27 | -0.24 | -0.21 | -0.18 | -0.15 | -0.12 | -0.09 | -0.06 |
|---|---|---|---|---|---|---|---|---|---|---|
| 40.0 | | | | | | 99.2 | 93.8 | | | |
| 38.5 | | | 84.3 | 87.2 | 89.7 | 95.4 | 93.6 | 92.8 | 85.1 | |
| 37.0 | | 58.8 | 73.7 | 85.4 | 89.8 | 92.0 | 90.9 | 86.3 | 76.5 | 53.9 |
| 35.5 | 54.7 | 68.1 | 72.3 | 83.4 | 87.1 | 88.4 | 88.3 | 81.0 | 67.0 | |
| 34.0 | 39.0 | 61.1 | 69.2 | 78.8 | 85.3 | 86.3 | 81.4 | 78.3 | 52.2 | |
| 32.5 | 54.2 | 59.1 | 62.8 | 75.5 | 81.6 | 80.7 | 78.2 | 71.3 | 58.1 | |
| 31.0 | | 51.6 | 59.1 | 72.8 | 76.9 | 76.9 | 72.7 | 65.7 | | |
| 29.5 | | 50.3 | 61.2 | 67.5 | 70.8 | 73.0 | 70.3 | 52.7 | 42.9 | |
| 28.0 | | | | 58.5 | 64.2 | 71.0 | 61.2 | 43.3 | | |

FIG. 2

| D/F | -0.33 | -0.3 | -0.27 | -0.24 | -0.21 | -0.18 | -0.15 | -0.12 | -0.09 | -0.06 |
|---|---|---|---|---|---|---|---|---|---|---|
| 40.0 | | | | | | | | | | |
| 38.5 | | | 84.3 | 87.2 | 89.7 | 95.4 | 93.6 | 92.8 | | |
| 37.0 | | | 73.7 | 85.4 | 89.8 | 92.0 | 90.9 | 86.3 | | |
| 35.5 | | | 72.3 | 83.4 | 87.1 | 88.4 | 88.3 | 81.0 | | |
| 34.0 | | | 69.2 | 78.8 | 85.3 | 86.3 | 81.4 | 78.3 | | |
| 32.5 | | | 62.8 | 75.5 | 81.6 | 80.7 | 78.2 | 71.3 | | |
| 31.0 | | | 59.1 | 72.8 | 76.9 | 76.9 | 72.7 | 65.7 | | |
| 29.5 | | | 61.2 | 67.5 | 70.8 | 73.0 | 70.3 | 52.7 | | |
| 28.0 | | | | 58.5 | 64.2 | 71.0 | 61.2 | 43.3 | | |

METHOD FOR ACCURATELY OBTAINING PHOTOLITHOGRAPHY PARAMETER

CROSS-REFERENCE TO RELATED APPLICATIONS

This is a continuation of International Application No. PCT/CN2021/097740, filed on Jun. 1, 2021 and entitled "METHOD FOR ACCURATELY OBTAINING PHOTOLITHOGRAPHY PARAMETER", which claims priority to Chinese patent application No. 202010777000.8, filed to the China National Intellectual Property Administration on Aug. 5, 2020 and entitled "METHOD FOR ACCURATELY OBTAINING PHOTOLITHOGRAPHY PARAMETER". The disclosures of International Application No. PCT/CN2021/097740 and Chinese patent application No. 202010777000.8 are hereby incorporated by reference in their entireties.

TECHNICAL FIELD

The present disclosure relates to the field of semiconductor manufacturing, and in particular to a method for accurately obtaining a photolithography parameter in a photolithography process.

BACKGROUND

In large-scale production of a chip, how to ensure the uniformity and stability of feature size, that is, a line width, is very important to stabilize product yield. The stable product yield is generally achieved by accurately determining a photolithography process window and an exposure condition. Herein, the photolithography process window refers to exposure energy and a focus value range that may be used for production, and the exposure condition refers to the exposure energy and a focus value set at the time of production.

At present, after original data such as the exposure energy and the focus value are obtained, an engineer needs to manually screen the original data and manually draws a curve according to screened data to obtain the exposure condition. The disadvantages of the method lie in that, it takes a lot of time, generally 60-90 minutes; and the screening standard is often related to experience of the engineer and is greatly influenced by human factors, so that the screening standard is not consistent, which is adverse to the stability of a manufacturing procedure.

Therefore, there is a need for a method for accurately obtaining a photolithography parameter, which can avoid influence of the human factors and improve the stability of a semiconductor manufacturing procedure.

SUMMARY

The present disclosure provides a method for accurately obtaining a photolithography parameter. The method includes the following steps.

Photolithography is performed on a target carrier with different preset photolithography parameters by using a same mask pattern as a mask, to obtain a plurality of target patterns.

Each of the target pattern is compared with a standard pattern to obtain an evaluation value, and the target pattern is set as a valid pattern, when the evaluation value corresponding to the target pattern is greater than or equal to a preset value.

A Bosung curve is drawn by taking a line width of the valid pattern and a preset photolithography parameter corresponding to the line width as data.

The photolithography parameter corresponding to a preset line width is obtained according to the Bosung curve.

DETAILED DESCRIPTION

Embodiments of a method for accurately obtaining a photolithography parameter provided by the present disclosure are described in detail below in combination with the accompanying drawings.

Figure 1:
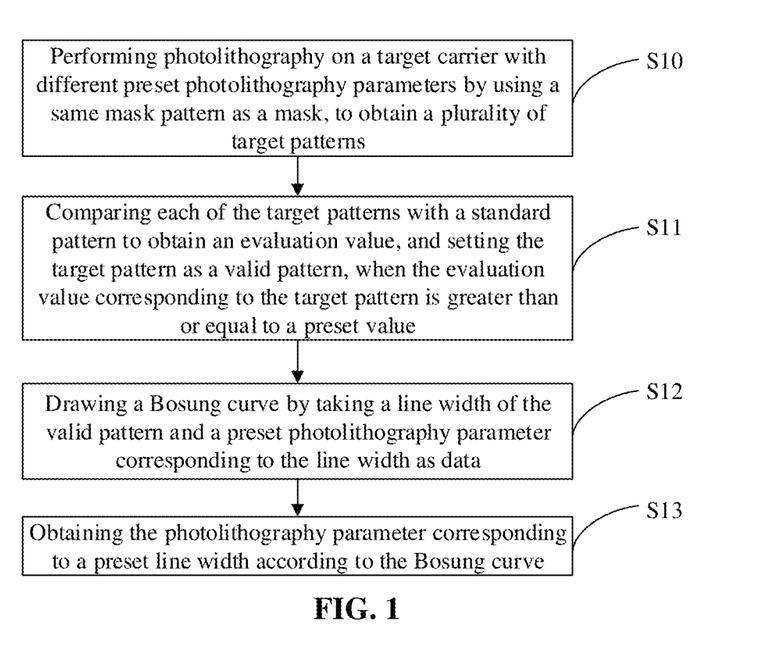
FIG. 1 is a flowchart of steps of a method for accurately obtaining a photolithography parameter according to an embodiment of the present disclosure.

FIG. 1 is a flowchart of steps of a method for accurately obtaining a photolithography parameter according to an embodiment of the present disclosure. Referring to FIG. 1, the method for accurately obtaining a photolithography parameter includes the following steps.

At S10, photolithography is performed on a target carrier with different preset photolithography parameters by using a same mask pattern as a mask, to obtain a plurality of target patterns.

The mask pattern is composed of photolithography patterns of a same type or different types. The type may refer to density of the photolithography pattern, such as a dense pattern, a semi-dense pattern, and an isolated pattern. The mask pattern may be composed of photolithography patterns of a single type, for example, isolated patterns, or may be composed of photolithography patterns of various types, for example, dense patterns and semi-dense patterns, or dense patterns and isolated island patterns, or dense patterns, the semi-dense patterns, and the isolated island patterns, and the like.

Regarding the mask pattern composed of photolithography patterns of a single type, it has the advantage that the complexity of a subsequent operation is simplified. Regarding the mask pattern composed of photolithography patterns of various types, it has the advantages that the obtained photolithography parameter is applicable to all pattern types on a wafer, and the universality of the photolithography parameter is improved.

The target carrier is a semiconductor substrate coated with a photoresist layer. The target pattern is formed on the photoresist layer. Specifically, in the embodiment, the semiconductor substrate is a silicon substrate, and the photoresist layer is formed on the silicon substrate.

In the step, the photoresist layer is exposed and developed with a first preset photolithography parameter by using a mask pattern as the mask, to form a first target pattern; the preset photolithography parameter is changed into a second preset photolithography parameter, and the photoresist layer is exposed and developed with a second preset photolithography parameter by using the same mask pattern as the mask, to form a second target pattern; the preset photolithography parameter is changed into a third preset photolithography parameter, and the photoresist layer is exposed and developed with the third preset photolithography parameter by using the same mask pattern as the mask, to form a third target pattern; and so on. In this way, the plurality of target patterns are obtained, and each target pattern corresponds to a different photolithography parameter.

The preset photolithography parameter is a combination of exposure energy and a focus value. In the embodiment, a test is performed by using a Focus-Energy Matrix (FEM) test approach, and the test may be set in a photolithography apparatus. In S10, the preset photolithography parameter is changed by taking each of the exposure energy and the focus value as a variable respectively. Specifically, the preset photolithography parameter is changed by taking the focus value as a fixed value and the exposure energy as the variable, or the preset photolithography parameter is changed by taking the exposure energy as the fixed value and the focus value as the variable. Specifically, when exposure is performed, the focus value is changed in one direction at a fixed step, the exposure energy is changed in another direction at another fixed step, each condition corresponds to one pattern (such as a cell in FIG. 2) on one wafer, to perform exposure and development are performed.

Figure 2:
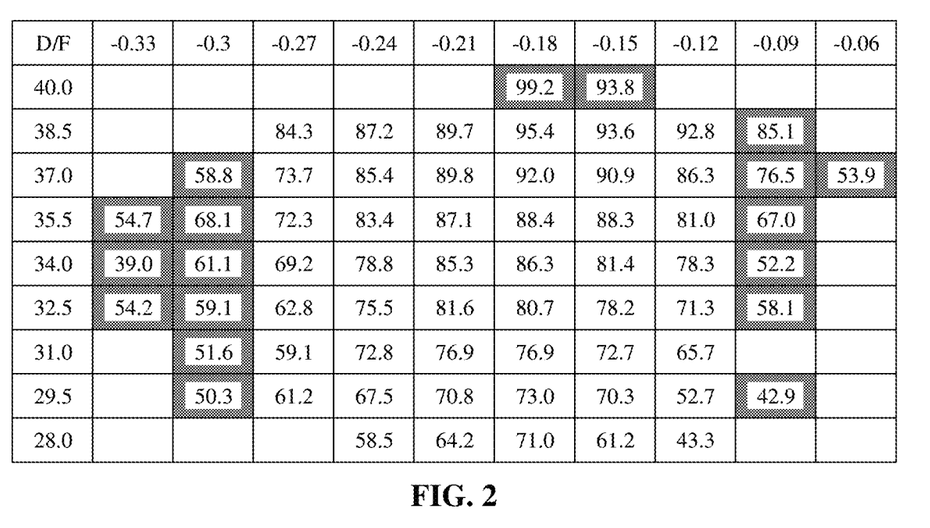
FIG. 2 and FIG. 3 are distribution diagrams of target patterns obtained by performing photolithography with different preset photolithography parameters by using a same mask pattern as a mask.

For example, referring to FIG. 2 which is a distribution diagram of target patterns obtained by performing photolithography with different preset photolithography parameters by using a same mask pattern as a mask. Each row has the same exposure energy D, each column has the same focus value F, each cell represents a pattern corresponding to a combination of the exposure energy D and the focus value F. When the target pattern is being manufactured, firstly the exposure energy D may be taken as the fixed value, for example, 40, while the focus value F may be changed sequentially at the fixed step, and the same mask pattern may be taken as the mask, to form a plurality of target patterns; and then the exposure energy D may be changed into another fixed value, for example, 38.5, while the focus value F may be changed sequentially at the fixed step, the same mask pattern may be taken as the mask, to form a plurality of target patterns, and so on, thereby forming a plurality of target patterns corresponding to different photolithography parameters. In other embodiments of the present disclosure, the exposure energy D may also be sequentially changed at the fixed step while the focus value F may be taken as the fixed value, and the same mask pattern is taken as the mask to form the plurality of target patterns. The principle is the same, and thus the explanation will not be repeated herein.

Further, it will be appreciated that since the target carrier (for example, a silicon wafer coated with photoresist) is circular, there is no pattern distribution in the distribution diagram outside of a circular region. Therefore, as shown in FIG. 2, the null value (for example, a region corresponding to exposure energy of 40.0 and the focus value of −0.3) exists in the distribution diagram.

At S11, the target pattern is compared with a standard pattern to obtain an evaluation value, and the target pattern is set as a valid pattern if the evaluation value corresponding to the target pattern is greater than or equal to a preset value.

The standard pattern is a pattern having an ideal shape, may be a pattern manufactured by simulating data, or may be an optimal pattern manually screened out after a series of tests. The standard pattern includes, but is not limited to, an existing goldenimage and the like. It will be appreciated that the shape of the standard pattern is the desired shape of the target pattern.

Typically, the standard pattern (for example, the goldenimage) is stored in a CD-SEM apparatus. After the target pattern is formed, the standard pattern may be compared with the target pattern in the CD-SEM apparatus to obtain the evaluation value, and the evaluation value may be recorded by the CD-SEM apparatus or a processing system as a reference value for the subsequent operation.

The preset value is a preset numerical value and is taken as an evaluation criterion of the evaluation value. The preset value may be set according to a requirement for the quality of the target pattern. For example, if the requirement for the quality of the target pattern is high, the preset value may be set as a high value, and if the requirement for the quality of the target pattern is not high, the preset value may be appropriately set as a low value.

In the step, if the evaluation value corresponding to the target pattern is greater than or equal to the preset value, it indicates that the difference between the target pattern and the standard pattern is within an allowable range, the target pattern is set as the valid pattern; and if the evaluation value corresponding to the target pattern is smaller than the preset value, it indicates that the difference between the target pattern and the standard pattern is not within the allowable range, the target pattern is set as an invalid pattern.

Further, in order to distinguish the valid pattern and the invalid pattern, the processing system may automatically mark the valid pattern or the invalid pattern, so that the processing system can recognize the two types of pattern data when processing the data. For example, the processing system only marks the valid pattern, or the invalid pattern, or marks the invalid pattern and the valid pattern with different marks. For example, in an embodiment, the processing system automatically performs shadow marking on the invalid pattern. Specifically, in the distribution diagram shown in FIG. 2, the cell corresponding to the invalid pattern is covered by a shadow and the cell corresponding to the valid pattern is uncovered, so that the valid pattern and the invalid pattern are distinguished. In other embodiments of the present disclosure, other marking methods may also be adopted to distinguish the valid pattern and the invalid pattern. For example, in an embodiment of the present disclosure, the processing system automatically adopts color covering for the cell corresponding to the invalid pattern, for example, yellow covering and the like. In another embodiment of the present disclosure, the processing system automatically adopts red border circling for the invalid pattern. It will be appreciated that in other embodiments of the present disclosure, other marks that can be identified by the system may also be adopted. According to the present disclosure, the processing system may automatically distinguish the valid pattern and the invalid pattern, so that manual distinguishment is avoided, the working efficiency is greatly improved, the production time is reduced, the accuracy is improved, and an error is avoided.

Further, the present disclosure further proposes a method for comparing the target pattern with the standard pattern. Specifically, scanned images of the target pattern and the standard pattern are obtained. The scanned image may be a scanned image obtained through SEM scan. Pixel gray scale comparison is performed on the scanned image of the target pattern and the scanned image of the standard pattern to obtain similarity of the target pattern and the standard pattern. The similarity is the evaluation value. It will be appreciated that in the case that the evaluation value is a similarity, the preset value is also a similarity.

Of course, those skilled in the art may also adopt other methods to compare the target pattern with the standard pattern, and the present disclosure is not limited herein.

Further, a range of the preset value is in a range of 70% to 85%. If the preset value is excessively great, excessively few valid patterns may be screened out, causing an inaccurate Bosung curve subsequently drawn, and thus a reduced product yield; and if the preset value is excessively small, the difference between the screened valid pattern and the standard pattern is excessively high, causing an inaccurate the Bosung curve subsequently drawn, and thus a reduced product yield.

At S12, a Bosung curve is drawn by taking a line width of the valid pattern and a preset photolithography parameter corresponding to the line width as data.

Since the line width of the valid pattern needs to be taken as the data for drawing the Bosung curve in S12, the line width of the valid pattern needs to be obtained before the S12 is executed.

In an embodiment of the present disclosure, before the step (S11) that the target pattern is compared with the standard pattern, the line width of the target pattern is obtained, so that in the step (S12) of drawing the curve, the line width corresponding to the valid pattern may be directly used. Specifically, in the embodiment, after the target pattern is manufactured in S10, the line width of the target pattern is measured. For example, in the distribution diagram as shown in FIG. 2, a number marked in each cell is the line width of the target pattern. The line width of the target pattern may be measured by adopting an existing apparatus for measuring the line width, for example, the CD-SEM. In the embodiment, since a comparison step (S11) is not performed, that is, the valid pattern is not screened out, the line width measurement is performed on all target patterns to obtain the line widths of all target patterns. In S12, line width data corresponding to the valid pattern is selected according to the valid pattern as the data for drawing the Bosung curve.

Figure 3:
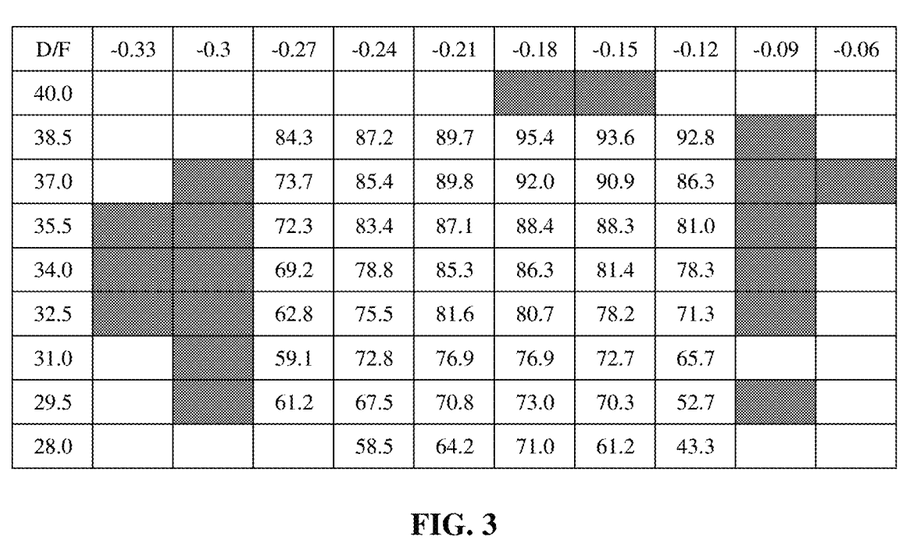

However, in another embodiment of the present disclosure, the line width of the target pattern is not obtained before the step (S11) that the target pattern is compared with the standard pattern, but the line width of the valid pattern is obtained after the step (S11) that the target pattern is compared with the standard pattern. Specifically, in the embodiment, if the valid pattern is screened out after S11 ends, only the line width of the valid pattern is measured. For example, as shown in FIG. 3 which is a distribution diagram of target patterns obtained by performing photolithography with different preset photolithography parameters by using the same mask pattern as a mask, the number marked in the cell of each valid pattern is the line width of the valid pattern. The line width of the valid pattern may be measured by adopting the existing apparatus for measuring the line width, for example, the CD-SEM. In the embodiment, the operation of measuring the line width is executed only after the comparison step (S11) is executed, that is, after the valid pattern is screened out, so that the line width of the invalid pattern does not need to be measured, the measurement time is reduced, and the production efficiency is improved. In S12, the line width data corresponding to the valid pattern is selected as the data for drawing the Bosung curve.

In an embodiment, the preset photolithography parameter is a combination of exposure energy and a focus value, so that in the step of drawing a Bosung curve by taking a line width of the valid pattern and a preset photolithography parameter corresponding to the line width as data, one of the exposure energy and the focus value needs to be set as the fixed value, and the other one and the line width of the valid pattern are taken as the data to draw the Bosung curve. The Bosung curve is a curve of the line width as a function of the exposure energy and the focus value.

Figure 5:
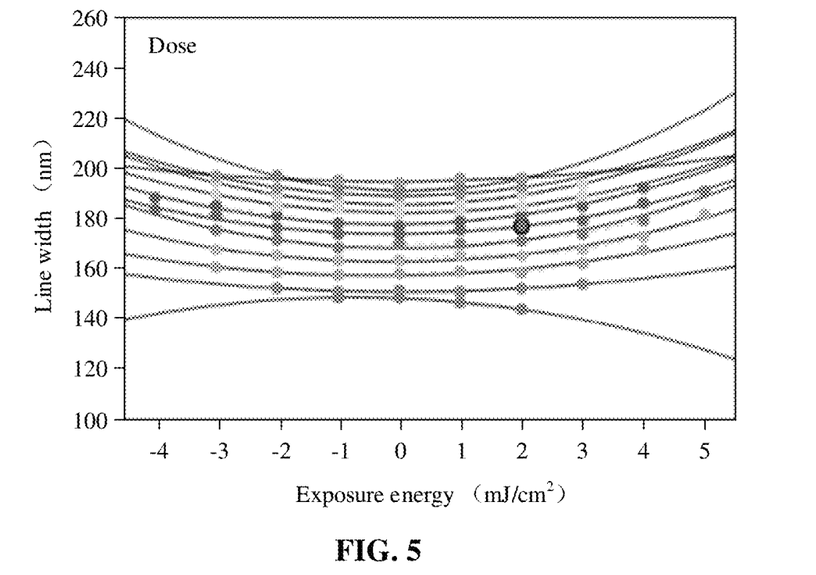
FIG. 5 is a set of Bosung curves drawn by taking a focus value as a fixed value, a line width of the valid pattern as an ordinate and exposure energy as an abscissa.

For example, each piece of exposure energy corresponds to a respective Bosung curve, and a plurality of pieces of exposure energy correspond to a plurality of Bosung curves. FIG. 5 is a set of Bosung curves drawn by taking a focus value as a fixed value, a line width of the valid pattern as an ordinate, and exposure energy as an abscissa. Each focus value corresponds to a respective Bosung curve, and a plurality of focus values correspond to a plurality of Bosung curves.

At S13, the photolithography parameter corresponding to a preset line width is obtained according to the Bosung curve.

Figure 4:
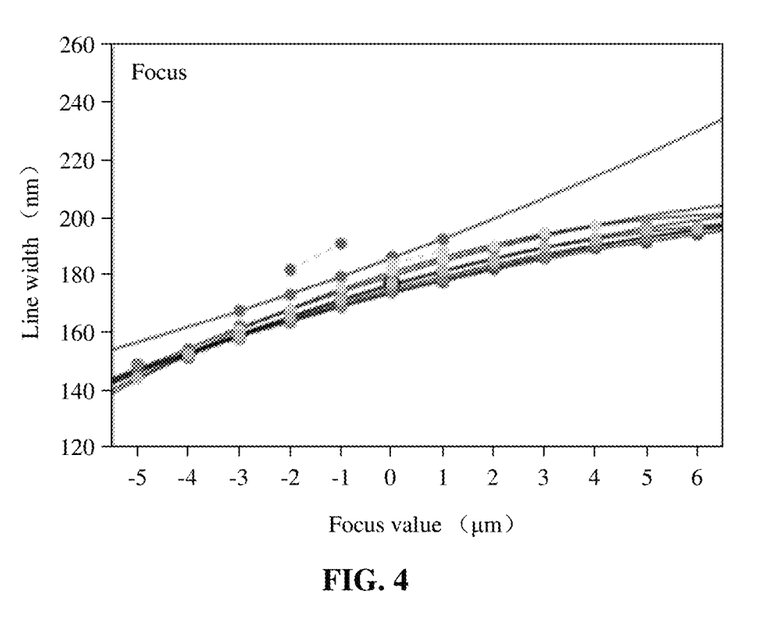
FIG. 4 is a set of Bosung curves drawn by taking exposure energy as a fixed value, a line width of a valid pattern as an ordinate, and a focus value as an abscissa.

When the photolithography parameter needs to be determined, the photolithography parameter corresponding to the preset line width is selected from the set of the Bosung curves shown in FIG. 4 or FIG. 5 according to the preset line width. Since the set of the Bosung curves includes a plurality of Bosung curves, the preset line width may correspond to a plurality of photolithography parameters, and the photolithography parameters corresponding to the Bosung curve with a gentle trend may be selected as the photolithography parameter adopted in actual production.

According to the present disclosure, the invalid pattern is excluded before the Bosung curve is drawn, and only the data of the valid pattern is adopted to draw the Bosung curve, so that the error may be reduced, and a more accurate reference is provided for the subsequent selection of the photolithography parameter. Meanwhile, according to the present disclosure, the valid pattern is screened out by comparing the target pattern with the standard pattern. The procedure can be directly completed in a processor, and manual screening is not needed, so that the screening consistency is greatly improved, influence of a human factor on the screening of the valid pattern is avoided, and the stability of a manufacturing procedure is guaranteed. The processing speed of the processor is far higher than the manual processing speed, for example, in an embodiment of the present disclosure, the processing speed of the processor is smaller than 2 minutes, compared with the manual processing speed of 60-90 minutes, the processing time is greatly reduced, and the production efficiency is improved.

The technical problem to be solved by the present disclosure is to provide a method for accurately obtaining a photolithography parameter. The method can avoid influence of human factors on selection of the photolithography parameter, improve the stability of a semiconductor manufacturing procedure, greatly reduce the production time and improve the production efficiency.

In order to solve the above problem, the present disclosure provides a method for accurately obtaining a photolithography parameter. The method includes the following steps.

Photolithography is performed on a target carrier with different preset photolithography parameters by using a same mask pattern as a mask, to obtain a plurality of target patterns.

Each of the target pattern is compared with a standard pattern to obtain an evaluation value, and the target pattern is set as a valid pattern, when the evaluation value corresponding to the target pattern is greater than or equal to a preset value.

A Bosung curve is drawn by taking a line width of the valid pattern and a preset photolithography parameter corresponding to the line width as data.

The photolithography parameter corresponding to a preset line width is obtained according to the Bosung curve.

In some embodiments, the mask pattern is composed of photolithography patterns of a same type or different types.

In some embodiments, the target carrier is a semiconductor substrate coated with a photoresist layer. The target pattern is formed on the photoresist layer.

In some embodiments, the preset photolithography parameter is a combination of exposure energy and a focus value. In the step of performing photolithography on the target carrier with different preset photolithography parameters by using the same mask pattern as the mask, the preset photolithography parameter is changed by taking each of the exposure energy and the focus value as a variable respectively.

In some embodiments, the step that a Bosung curve is drawn by taking a line width of the valid pattern and the preset photolithography parameter corresponding to the line width as data further includes that: the Bosung curve is drawn by taking the exposure energy as a fixed value and taking the line width of the valid pattern and the focus value as the data, or the Bosung curve is drawn by taking the focus value as the fixed value and taking the line width of the valid pattern and the exposure energy as the data.

In some embodiments, a method for comparing the target pattern with the standard pattern includes that scanned images of the target pattern and the standard pattern are obtained, and pixel gray scale comparison is performed on the scanned images to obtain similarity of the target pattern and the standard pattern. The similarity is the evaluation value.

In some embodiments, the preset value is in a range of 70% to 85%.

In some embodiments, when the evaluation value corresponding to the target pattern is smaller than the preset value, the target pattern is set as an invalid pattern.

In some embodiments, the valid pattern or the invalid pattern is marked to distinguish the valid pattern and the invalid pattern.

In some embodiments, before the step that the target pattern is compared with the standard pattern, the line width of the target pattern is obtained.

In some embodiments, after the step that the target pattern is compared with the standard pattern, the line width of the valid pattern is obtained.

The advantages of the present disclosure lie in that, the target pattern is screened by using the standard pattern, a screening procedure is standardized, an error caused by inconsistent manual screening standards is avoided, the influence of the human factors on the selection of the photolithography parameter is reduced, and the stability of the semiconductor manufacturing procedure is greatly improved, and meanwhile, the production efficiency is greatly improved since a manual operation is not needed.

The above descriptions are merely preferred embodiments of the present disclosure. It should be pointed out that those of ordinary skill in the art may further make multiple improvements and modifications without departing from a principle of the present disclosure and those improvements and modifications also should be considered as the protection scope of the present disclosure.

In the embodiment of the present disclosure, photolithography is performed on a target carrier with different preset photolithography parameters by using the same mask pattern as a mask, to obtain a plurality of target patterns; the target pattern is compared with a standard pattern to obtain an evaluation value, and the target pattern is set as a valid pattern if the evaluation value corresponding to the target pattern is greater than or equal to a preset value; a Bosung curve is drawn by taking a line width of the valid pattern and a preset photolithography parameter corresponding to the line width as data; and the photolithography parameter corresponding to a preset line width is obtained according to the Bosung curve. In this way, the target pattern is screened by using the standard pattern, a screening procedure is standardized, an error caused by manual screening standard nonuniformity is avoided, the influence of the human factor on the selection of the photolithography parameter is reduced, and the stability of the semiconductor manufacturing procedure is greatly improved, and meanwhile, the production efficiency is greatly improved since a manual operation is not needed.

The invention claimed is:

1. A method for accurately obtaining a photolithography parameter, comprising:
   performing photolithography on a target carrier with different preset photolithography parameters by using a same mask pattern as a mask, to obtain a plurality of target patterns;
   comparing each of the target patterns with a standard pattern to obtain an evaluation value, and setting the target pattern as a valid pattern, when the evaluation value corresponding to the target pattern is greater than or equal to a preset value;
   drawing a Bosung curve by taking a line width of the valid pattern and a preset photolithography parameter corresponding to the line width as data; and
   obtaining the photolithography parameter corresponding to a preset line width according to the Bosung curve.

2. The method for accurately obtaining the photolithography parameter of claim 1, wherein the mask pattern is composed of photolithography patterns of a same type or different types.

3. The method for accurately obtaining the photolithography parameter of claim 1, wherein the target carrier is a semiconductor substrate coated with a photoresist layer, and the target pattern is formed on the photoresist layer.

4. The method for accurately obtaining the photolithography parameter of claim 1, wherein the preset photolithography parameter is a combination of exposure energy and a focus value, in the step of performing photolithography on the target carrier with different preset photolithography parameters by using the same mask pattern as the mask, the preset photolithography parameter is changed by taking each of the exposure energy and the focus value as a variable respectively.

5. The method for accurately obtaining the photolithography parameter of claim 4, wherein drawing the Bosung curve by taking the line width of the valid pattern and the preset photolithography parameter corresponding to the line width as data further comprises:
   drawing the Bosung curve by taking the exposure energy as a fixed value and taking the line width of the valid pattern and the focus value as the data, or
   drawing the Bosung curve by taking the focus value as the fixed value and taking the line width of the valid pattern and the exposure energy as the data.

6. The method for accurately obtaining the photolithography parameter of claim 1, wherein comparing the target pattern with the standard pattern comprises:

obtaining scanned images of the target pattern and the standard pattern, and performing pixel gray scale comparison on the scanned images to obtain similarity of the target pattern and the standard pattern, the similarity being the evaluation value.

7. The method for accurately obtaining the photolithography parameter of claim 6, wherein the preset value is in a range of 70% to 85%.

8. The method for accurately obtaining the photolithography parameter of claim 1, wherein when the evaluation value corresponding to the target pattern is smaller than the preset value, the target pattern is set as an invalid pattern.

9. The method for accurately obtaining the photolithography parameter of claim 8, wherein the valid pattern or the invalid pattern is marked to distinguish the valid pattern and the invalid pattern.

10. The method for accurately obtaining the photolithography parameter of claim 1, wherein before comparing the target pattern with the standard pattern, the line width of the target pattern is obtained.

11. The method for accurately obtaining the photolithography parameter of claim 1, wherein after comparing the target pattern with the standard pattern, the line width of the valid pattern is obtained.

\* \* \* \* \*